United States Patent
Kalhoff et al.

(10) Patent No.: US 9,674,972 B2
(45) Date of Patent: Jun. 6, 2017

(54) MODULAR ELECTRONIC SYSTEM AND BUS SUBSCRIBER

(71) Applicant: Phoenix Contact GmbH & Co. KG, Blomberg (DE)

(72) Inventors: Johannes Kalhoff, Blomberg (DE); Peter Scholz, Brakel (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 14/437,838

(22) PCT Filed: Oct. 24, 2013

(86) PCT No.: PCT/EP2013/072303
§ 371 (c)(1),
(2) Date: Apr. 23, 2015

(87) PCT Pub. No.: WO2014/064208
PCT Pub. Date: May 1, 2014

(65) Prior Publication Data
US 2015/0289394 A1    Oct. 8, 2015

(30) Foreign Application Priority Data

Oct. 24, 2012   (DE) .......................... 10 2012 110 173

(51) Int. Cl.
*H05K 5/00*         (2006.01)
*H02J 5/00*         (2016.01)
(Continued)

(52) U.S. Cl.
CPC ........... *H05K 5/0082* (2013.01); *H02B 1/052* (2013.01); *H02J 5/005* (2013.01); *H04B 5/0012* (2013.01);
(Continued)

(58) Field of Classification Search
CPC ........... H01F 38/14; H02J 5/005; H02J 7/025
See application file for complete search history.

(56) References Cited

U.S. PATENT DOCUMENTS

RE25,317 E  *  1/1963  McCoy ................. H05K 7/142
                                                        330/66
3,409,805 A *  11/1968  Whipple ............... H05K 1/144
                                                       336/200
(Continued)

FOREIGN PATENT DOCUMENTS

CA    WO 2011091528 A1 *  8/2011  ............. H01F 38/14
CN         102084442 A       6/2011
(Continued)

OTHER PUBLICATIONS

International Application No. PCT/EP2013/072303 "International Preliminary Report on Patentability", May 7, 2015, Publisher: International Bureau of WIPO.
(Continued)

*Primary Examiner* — Robert J Hoffberg
(74) *Attorney, Agent, or Firm* — Kaplan Breyer Schwarz, LLP (57) ABSTRACT

A modular electronic system for receiving, processing or forwarding information. Devices comprise a housing including flat electromagnetically effective transfer elements in or on an insulating housing wall and at least one circuit board including flat electromagnetically effective transfer elements and electronic components.

15 Claims, 5 Drawing Sheets

(51) Int. Cl.
    *H04W 4/00*     (2009.01)
    *H05K 7/14*     (2006.01)
    *H02B 1/52*     (2006.01)
    *H02B 1/052*    (2006.01)
    *H04B 5/00*     (2006.01)

(52) U.S. Cl.
    CPC ......... *H04B 5/0031* (2013.01); *H04B 5/0037* (2013.01); *H04B 5/0075* (2013.01); *H04W 4/008* (2013.01); *H05K 7/1427* (2013.01)

(56) References Cited

U.S. PATENT DOCUMENTS

| | | | | |
|---|---|---|---|---|
| 5,995,380 | A * | 11/1999 | Maue | B60R 16/0238 174/254 |
| 6,075,433 | A * | 6/2000 | Ono | H01F 38/14 336/212 |
| 6,396,391 | B1 | 5/2002 | Binder | |
| 6,736,646 | B2 * | 5/2004 | Takahashi | H01R 13/6633 439/39 |
| 7,800,222 | B2 * | 9/2010 | Schulz | H01L 23/041 257/723 |
| 7,830,116 | B2 * | 11/2010 | Toya | H02J 7/025 320/108 |
| 7,865,648 | B2 * | 1/2011 | Kuschke | H01R 9/2675 361/729 |
| 7,922,961 | B2 * | 4/2011 | Chisholm | G06K 19/07749 264/516 |
| 8,295,899 | B2 * | 10/2012 | Hashizume | H01Q 1/243 455/575.3 |
| 8,633,616 | B2 * | 1/2014 | Soar | B60N 2/24 307/104 |
| 8,853,891 | B2 * | 10/2014 | Soar | F41H 1/02 307/104 |
| 9,240,702 | B2 * | 1/2016 | Soar | H01F 27/365 |
| 9,331,495 | B2 * | 5/2016 | Soar | F41G 1/34 |
| 2004/0005809 | A1 * | 1/2004 | Suzuki | H01F 27/22 439/485 |
| 2004/0244856 | A1 * | 12/2004 | Schauz | F15B 13/0821 137/884 |
| 2009/0059543 | A1 * | 3/2009 | Choe | H05K 1/0284 361/752 |
| 2009/0157937 | A1 | 6/2009 | Kuschke et al. | |
| 2009/0191726 | A1 * | 7/2009 | Park | H05K 1/144 439/65 |
| 2009/0237194 | A1 | 9/2009 | Waffenschmidt et al. | |
| 2011/0127845 | A1 | 6/2011 | Walley et al. | |
| 2014/0047754 | A1 * | 2/2014 | Compton | F41C 27/00 42/84 |
| 2014/0111147 | A1 * | 4/2014 | Soar | H01F 27/365 320/108 |
| 2014/0325111 | A1 * | 10/2014 | Peng | G06F 13/409 710/300 |
| 2015/0020427 | A1 * | 1/2015 | Compton | F41C 27/00 42/71.01 |
| 2015/0146018 | A1 * | 5/2015 | Kayser | H04N 5/23241 348/207.1 |
| 2015/0198981 | A1 * | 7/2015 | Chung | G06F 1/1656 361/679.55 |
| 2016/0108535 | A1 * | 4/2016 | Chung | G06F 1/1656 205/125 |

FOREIGN PATENT DOCUMENTS

| | | |
|---|---|---|
| DE | 19719730 C1 | 10/1988 |
| DE | 102007017637 A1 | 10/2008 |
| EP | 1484511 B1 | 7/2006 |
| EP | 1885085 A1 | 2/2008 |
| EP | 2073315 A2 | 6/2009 |

OTHER PUBLICATIONS

"Office Action" issued in counterpart Chinese Patent Application No. 201380060235.3, dated 03120/2016, Published in: CN.

"Related International Application No. PCT/EP2013/072303", "International Search Report", Dec. 18, 2013, Publisher: ISA/EPO, Published in: EP.

"Related International Application No. PCT/EP2013/072303", "International Search Report and Written Opinion of the International Searching Authority", Dec. 9, 2013, Publisher: ISA/EPO, Published in: EP.

English Translation of German "Office Action" issued in counterpart German Patent Application No. 102012110173.6, dated Jul. 19, 2013, Published in: DE.

* cited by examiner

MODULAR ELECTRONIC SYSTEM AND BUS SUBSCRIBER

FIELD OF THE INVENTION

The invention relates to a modular electronic system for receiving, processing or forwarding information, in particular in conjunction with a bus system and a number of subscriber devices, and also relates to an individual bus subscriber.

BACKGROUND OF THE INVENTION

EP 1 484 511 B1 discloses a concatenation module for controlling an electrical valve drive of a fluid valve arrangement, comprising a housing with concatenation contacts on the housing for making electrical contact to a further concatenation module. The housing is in form of an injection molded three-dimensional circuit board of the molded interconnect device (MID) type and comprises conductive traces and electrical components for controlling and monitoring functions and/or for a communication function.

DE 197 19 730 C1 discloses a plug-in connection for potentially explosive areas for energy and data transfer between at least one electrical load and a bus system, which comprises a transformer including a primary part and a secondary part each one arranged in a respective connecter half housing so as to be separable and mateable.

The primary part housing includes a limiting means for electrical quantities (current/voltage), while the interior of the secondary part housing can be dedicated to the potentially explosive area.

Certain electronic devices have to be very compact, which means that spatial issues have to be addressed skillfully. At the same time, the electronic components of the devices should exhibit good insulation and dielectric strength, particularly in potentially explosive areas.

Electronic systems operating with bus systems often include a rail for accommodating parts of the bus system and for mounting subscriber devices which are plugged thereto. Subscriber devices usually accommodate one or more circuit boards equipped with electronic components that receive, process, and forward signals. Power supply and signal input and output is effected via the bus system. The circuit boards may have single- or multilayered designs, and flexible or other three-dimensional conductor configurations with electronic components connected thereto may also be used. Such structures will simply be referred to as a circuit board below.

The subscriber devices of the bus system are subject to various requirements. For safety reasons, the bus subscriber should be galvanically isolated from its power source and data interface. Furthermore, a small width of the subscriber devices is desirable so that many devices can be accommodated side by side on a support rail.

SUMMARY OF THE INVENTION

The invention is based on the object to provide a modular electronic system that provides for a compact design with good isolation of the electronic components. In particular a space-saving power supply of electronic devices should be enabled.

The term "electromagnetically effective transfer element" refers to an inductive or capacitive coupling member comprising a coil, an antenna, or a capacitor plate. The term "connection means" refers to a galvanic or electromagnetic connection to an electronic device for the purpose of supplying electrical operating power and/or signal energy (including information content). The term "flat" refers to a component having an extension in a plane that is considerably larger than in the direction perpendicular to this plane.

In the context of this application the term "bus system" also encompasses a pure bus for power supply of the bus devices which are also referred to as bus subscribers in the art. For example, a bus system may comprise just two lines through which a DC voltage is provided, which is tapped by several bus subscribers via contact connections. Hence, a single voltage source to which at least two bus subscribers are connected in parallel will also be referred to as a bus system.

The term "modular" may mean, for example, that the bus subscriber can be inserted into the overall system and removed from the overall system without thereby affecting or impairing the functionality of the overall system. "Modular" may further mean that the functionality of the electrical device, e.g. of the bus subscriber, can be expanded using expansion cards, so that the electrical device, e.g. the bus subscriber, does not have to be equipped with all functionality already in the manufacturing stage.

One aspect of the invention relates to the configuration of the housing for an electrical device, in particular a bus subscriber, which may be a measuring device, an automation module, or a control device, for example.

At least one first transfer element may be arranged on or in one of the housing parts, which transfer element may be a primary coil of a transformer, or a transmitting antenna for inductively injecting electrical energy into a second transfer element (secondary coil). The housing wall may have a multilayered design, in which case the first transfer element (the primary coil) is arranged in an intermediate layer.

The electrical signal may be a measurement signal or a data signal, and additionally the power for operating the electronic components of the device may be transferred. Preferably, the measurement signal or data signal is transferred separately from the operating power, but a simultaneous transfer of energy and information via the same transfer elements is also possible, for example by modulating data to a current of energy.

In other words, a transformer may be arranged in the housing, in which case the primary coil of the transformer is arranged in or on the housing wall as a part of the housing, and the secondary coil of the transformer is arranged in the interior of the housing, on or with or within a circuit board.

The feeding into the primary coil is preferably accomplished using a galvanic coupler, such as a plug-in connector, but a capacitive or inductive coupler may also be used. The two latter couplers have the advantage that there will be no contact-type connection between the connection means to a bus system, for example, and the electrical device, which enables a good encapsulation of the housing, for example for protection against external influences.

The configuration according to the invention allows for a non-contact type supply of electrical energy and/or data signals to the electronic components accommodated in the housing, which are thus galvanically isolated from the power source. At the same time the space required for the electronic components is reduced.

Thus, the advantages achieved with the housing are:
space and cost savings in the implementation of the electronic components;
galvanic isolation of the electronic components from the power source; and
simplification of the power supply for the electronic components.

Another aspect of the invention relates to a modular electronic system comprising at least one electrical device, e.g. bus subscriber, which may be an electronic module such as a measuring device, automation module, or a control device.

The electrical device, e.g. bus subscriber, may comprise an electronic circuit which is arranged in an interior of the subscriber housing or within a wall thereof.

The electronic circuit may be provided in form of an operating means such as a relay, impulse switch, timer, or circuit breaker, or in form of a measuring device, automation module, isolation amplifier, or control device.

The electrical device, e.g. bus subscriber, may include the following components:
 a housing;
 an electronic circuit disposed in the housing; and
 a transformer comprising at least one primary and at least one secondary coil for electromagnetic transfer of electrical energy to the electronic circuit coupled to the secondary coil, which energy comprises the power supply and optionally additionally a data signal.

The power supply can be provided as a radio-frequency voltage in order to keep the size of the transfer elements small. In the context of the present invention, radio-frequency refers to frequencies in the kilohertz (kHz) range and higher, up into the megahertz range.

The feeding into the primary coil may be effected using a galvanic coupler, for example a plug-in connector, if the radio-frequency voltage is supplied by the power supply units of the bus system, for example. Otherwise, radio-frequency voltage is generated from direct current or alternating current, for example that of the bus system.

Advantageous embodiments and modifications will now be described below. The features of the embodiments may be combined with one another and with each of the aspects of the invention, as far as technologically feasible.

According to one embodiment, the primary coil may be provided in overmolded form, as a molded interconnect device (MID) in an energy transfer wall of the housing, so as to be insulated and encapsulated.

The primary coil is wound as a flat thin spiral coil or thin antenna, or is printed on a substrate or etched out from deposited layers.

The secondary coil may be produced similarly or with the same technology as the primary coil. That is, the secondary coil may be provided as a molded interconnect device (MID), or as a spiral coil or antenna, or as an overmolded coil, or as a thin wound coil, a printed or "etched" coil, in or on the circuit board of the subscriber device.

The transformer may comprise two or more secondary coils, and also two or more primary coils which are electromagnetically coupled.

In a preferred embodiment, the electronic system includes a bus to which a plurality of subscriber devices may be connected.

The bus may be configured as a T-bus and may preferably implement a TCP/IP protocol, and the bus subscribers may be connected via RS-485, or radio.

The bus comprises a plurality of electrical lines, among which two lines may be provided for power supply and two or three lines for the data stream.

The bus lines may be disposed in or on a support rail. The support rail may be a profiled rail made of metal which is used for fastening the subscriber devices. The support rail is part of the switch system of bus lines which feed the supply voltage and the communication signals to the subscriber devices.

The support rail may be configured as a hat rail. The hat rail, for example a TS-35 rail or DIN rail, is a support rail having a U-shaped or hat-like profile. The hat rail or DIN rail has dimensions of 35×7.5 mm.

The bus may also be based on a hybrid transfer path which comprises an electrical line for power supply and a radio link for data signals.

The electronic system includes connection means to connect the bus subscriber to the bus system, galvanically or capacitively and/or inductively.

The connection means is arranged on the support rail and galvanically connects the supply line extending along the support rail to the respective subscriber device, optionally via an appropriate converter. For this purpose, the connection means may be configured as a plug-in connector, a T-bus element, or a T-bus connector.

The power supply voltage may be modulated with a data signal. In this case, the data signal may be considered as a low-frequency payload signal, and the supply voltage as a radio-frequency carrier.

The transfer path of the data signals may be different from the transfer path of the power supply voltage. For example, the power supply voltage may be transferred via line and the data signal via radio, or data signal and power supply voltage may be transferred on separate lines.

According to one embodiment, a switch may be provided for supplying the power supply voltage to a first primary coil and the data signal to a second primary coil.

Alternatively, the power supply voltage and the data signal may be fed to a single primary coil.

The electronic circuit may be encapsulated in the housing (dust-proof sealing).

According to one embodiment, the bus subscriber may include means for shielding electromagnetic fields, for example the subscriber housing may be enclosed by a ferrite foil, or a ferrite foil may be integrated into the housing wall.

The bus subscriber may comprise means for focusing the electromagnetic field lines of the coils, preferably a ferrite core. An optionally provided ferrite foil may also serve for this purpose.

The invention will now be explained in more detail by way of exemplary embodiments and with reference to the drawings wherein the same reference numerals designate the same or equivalent elements. The features of different exemplary embodiments may be combined with any aspect of the invention.

BRIEF DESCRIPTION OF THE FIGURES

In the drawings:

FIG. 7 shows an electrical device including a plurality of circuit boards and with electromagnetic energy transfer;

FIG. 8 shows an electrical device including an identification device; and

DETAILED DESCRIPTION

Figure 1:
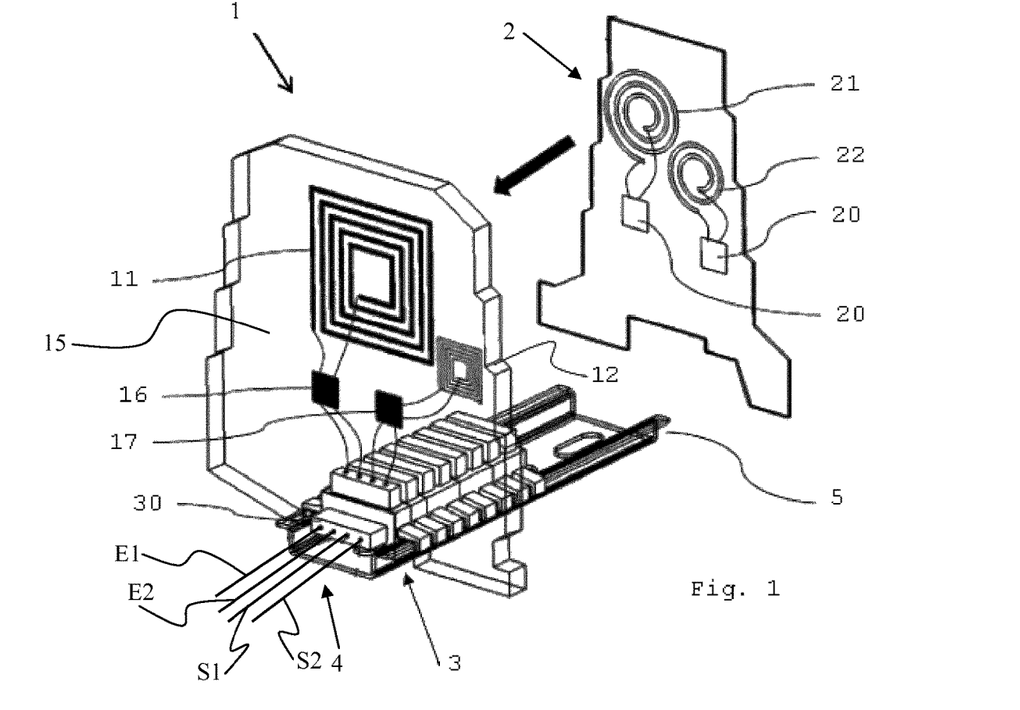
FIG. 1 is a schematic exploded view of a first embodiment of a bus subscriber.
Figure 2:
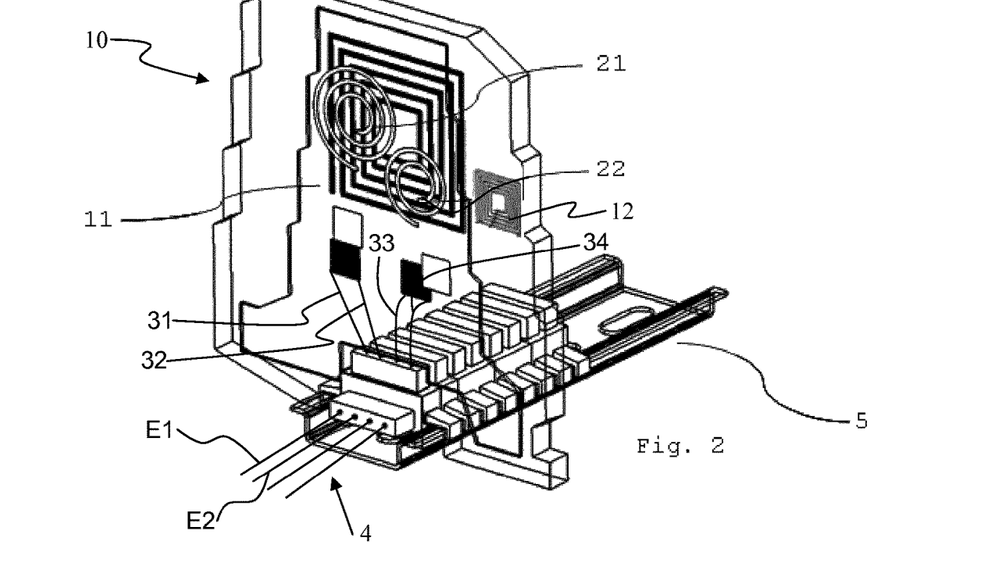
FIG. 2 is a perspective assembly view of the bus subscriber of FIG. 1.
Figure 3:
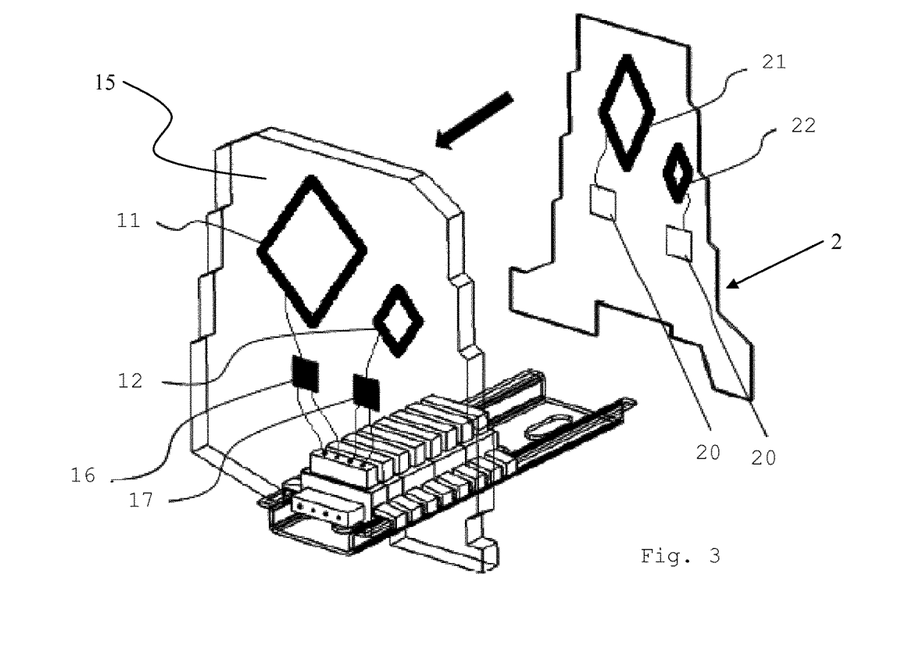
FIG. 3 is a schematic exploded view of a second embodiment of a bus subscriber.

The principal parts of the modular electronic system according to the invention include a number of subscriber devices 1, each having a housing 10 including an equipped circuit board 2, the devices being connected to a bus system 4 via respective connection means 3. The housing 10 may comprise two housing halves 13, 14 (FIG. 6) enclosing a cavity and enclosing and hence encapsulating the equipped circuit board 2 in dustproof or even gas-tight manner. Housing half 14 comprises an energy transfer wall 15 including at least a first flat primary transfer element 11 which in case of the embodiment according to FIGS. 1 and 2 is formed as a flat coil, and which in case of FIG. 3 is in form of one or more capacitor plate(s). Even if the wall 15 is only partially occupied by an electromagnetically effective transfer element, and irrespective of power or signal supply, the wall 15 will be referred to as an "energy transfer wall". As a counterpart to the first primary transfer element 11, a first secondary transfer element 21 is provided, which in case of FIGS. 1 and 2 is formed as a flat coil, and which in case of FIG. 3 is in form of one or more capacitor plate(s). The first secondary transfer element 21 forms part of the circuit board 2, where it was produced by known methods and, if desired, was encapsulated in the circuit board.

In the illustrated exemplary embodiments, a second primary transfer element 12 is arranged next to the first primary transfer element 11, and similarly a second secondary transfer element 22 is arranged next to the first secondary transfer element 21. The pairs of first transfer elements 11, 21 and second transfer elements 12, 22 are operated in parallel to each other. For this purpose, feed electronics 16, 17 are provided for the power supply part and the signal part of the subscriber device, which are associated with transfer elements 12, 22 and may be arranged incorporated in the housing wall 15 or in the connection means 3. Connection means 3 electrically connect the subscriber device 1 to the bus system 4, for which purpose a galvanic connection as well as a capacitive or inductive coupling through an electrical or electromagnetic alternating field are contemplated.

The bus system 4 comprises power transfer lines E1 and E2, and furthermore at least two signal lines S1 and S2 which extend in parallel to each other in a support rail 5. These lines E1, E2, S1, S2 are connected to the subscriber device 1 via connection means 3, for ultimately establishing a connection to electronic components 20 mounted on circuit board 2.

In the case of an electrical line connection to the subscriber device 1, the connection means 3 can be in form of a contact-making means, in particular a T-bus connector 30 that connects the bus lines E1, E2, S1, S2 with feed electronics 16 and 17 via connecting lines 31, 32, 33, 34. For this purpose, the lower end of subscriber device 1 is in form of a connection socket for electrical connection to connector 30 and for mechanical attachment to the rail 5. With regard to the power supply and supply of signals to the subscriber device, there are two options: DC or radio-frequency AC voltage can be used on the signal and power supply lines E1, E2, S1, S2. If DC voltage is used, a radio-frequency voltage is generated in each of feed electronics 16, 17, by means of which the radio-frequency energy can be transferred via primary transfer elements 11, 12 to the secondary transfer elements 21, 22. The electronic components of the subscriber device comprise rectifier circuits for converting the radio-frequency voltage into a DC voltage which is supplied to the signal processing electronic components 20 as an operating voltage. If the power supply lines E1, E2 of the bus system carry radio-frequency voltages, these voltages may be supplied to the primary transfer elements 11, 12 directly via the plug-in connectors 30 of connection means 3, or through the feed electronics in processed form.

The connection means 3 may also be embodied as an inductive or capacitive transformer which comprises primary and secondary transfer elements similar to transfer elements 11, 21; 12, 22. In particular inductive transformers are considered which have the primary coils arranged in the region of the support rail 5, while the secondary coils are located above this primary coil region and already belong to the subscriber device, advantageously being arranged in the energy transfer wall 15.

FIG. 1 shows the first embodiment of the electronic system prior to assembly of the subscriber device 1, and FIG. 2 after assembly. Electronic circuits 20 and transformers 11/21 and 12/22 are arranged in housing 10.

The transformers comprise two primary coils 11, 12 and two secondary coils 21, 22 for electromagnetically transferring a radio-frequency voltage, which is converted into a power supply DC voltage for the electronic circuits 20. Primary coils 11, 12 are enclosed and thus encapsulated in the insulating wall 15 of housing 10.

The primary coils 11, 12 of the transformers may be referred to as spiral transmit antennas and the secondary coils 21, 22 as spiral receive antennas. The feed electronics 16, 17 for primary coils 11, 12 may be arranged to form part of connection means 3 to provide for supply of power and data signals through an inductive coupling with secondary coils 21, 22.

Power supply lines E1, E2 are connected to primary coil 11, and signal lines S1, S2 are connected to primary coil 12 in order to obtain, on the secondary side, a suitable voltage for operating the electronic components 20 on the one hand, and on the other measurement signals or data signals to be processed by the electronic components 20. In particular for data signals it is also possible to reverse the transfer direction, so that for example coil 22 is used as a primary coil and coil 12 as a secondary coil of a signal transmitter.

Secondary coils 21, 22 are accommodated on or inside circuit board 2, and likewise the electronic components 20. The drawing is highly schematic. The actual arrangement of the circuit board 2 inside the housing can be seen from FIG. 6.

FIG. 2 shows the overlapping of the primary and secondary coils to form transformers or transducers. It is also possible to use unequal numbers of primary and secondary transfer elements. Thus, for example, one primary coil may be electromagnetically coupled to two secondary coils.

FIG. 3 shows a second embodiment of the electronic system. Energy transfer wall 15 accommodates capacitor plates encapsulated inside the wall as primary transfer elements 11, 12 and feed electronics 16, 17, while circuit board 2 carries capacitor plates as secondary transfer elements 21, 22 and electronic components 20. At the surfaces facing each other the energy transfer wall 15 and the circuit board 2 are shaped so that they may be placed adjacent to each other and may be sealingly joined to each other to obtain the subscriber device. Thus, data signals and power supply voltage are capacitively transferred to the electronic circuit including the electronic components 20 via the capacitor plates as the transfer elements 11, 21 and 12, 22.

Figure 4:
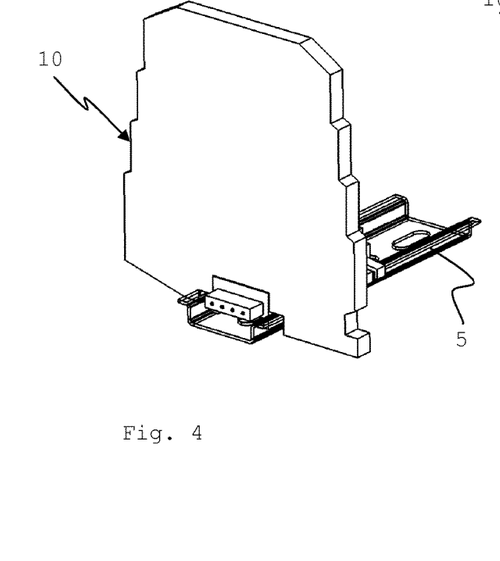
FIG. 4 is a perspective view of the subscriber housing according to the first or second embodiment, and of a hat rail.

FIG. 4 shows how narrow the housing 10 of a subscriber device may be built. For example, a width of only 6 mm as measured in the longitudinal direction of the rail may be achieved.

Figure 5:
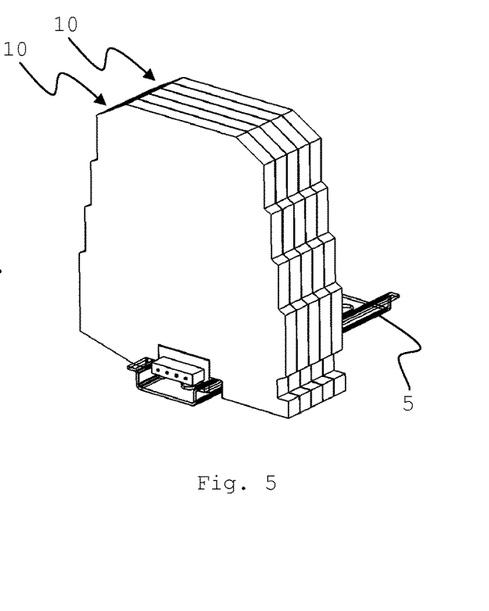
FIG. 5 is a perspective view of a plurality of subscriber housings plugged to a hat rail.

FIG. 5 shows a number of subscriber devices attached to a rail 5.

Figure 6:
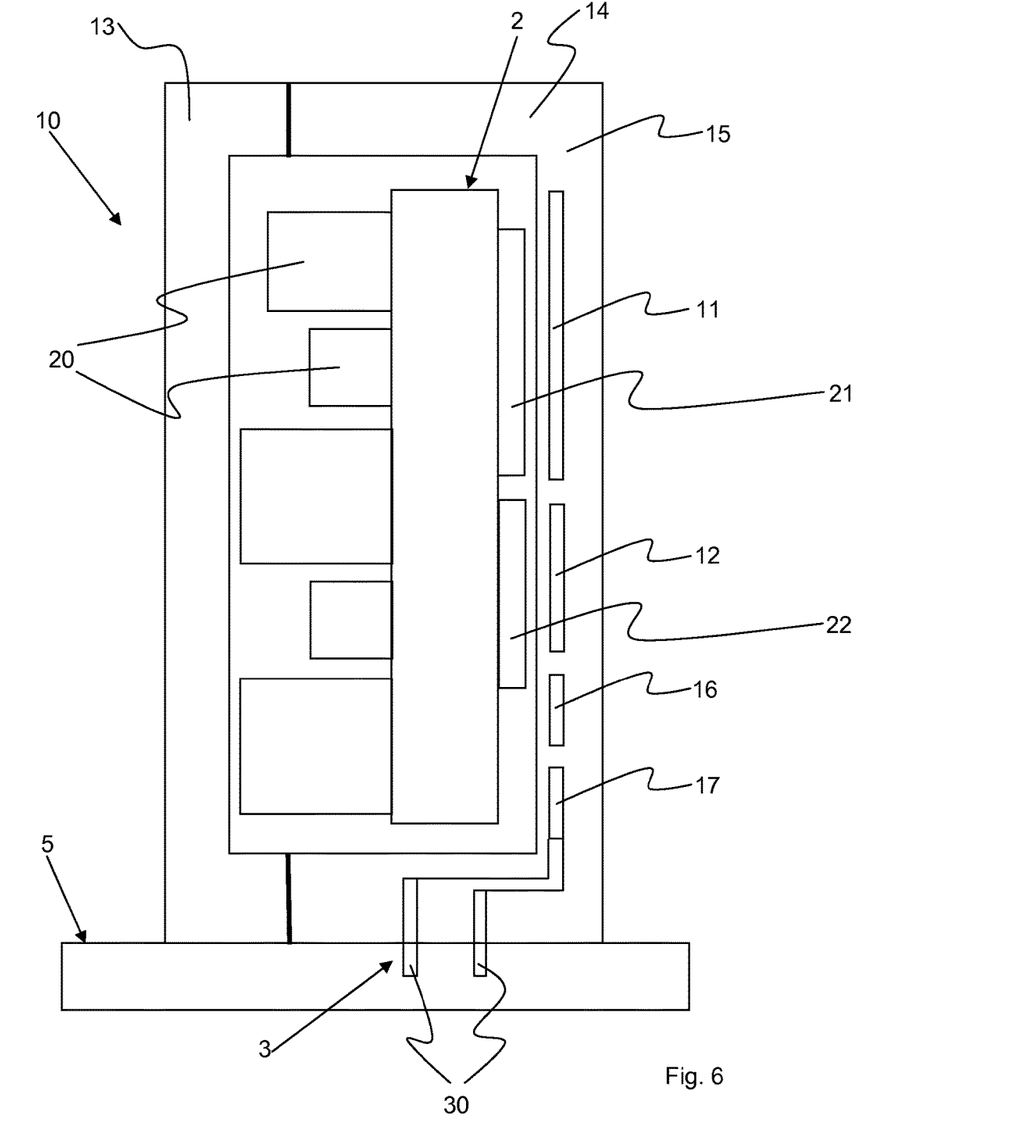
FIG. 6 is a sectional side view through a subscriber device.

FIG. 6 is a cross-sectional side view through a subscriber device.

Based on the invention it is possible to produce interface products having a width of less than 6 mm. At the same time, due to the space-saving energy transfer there is enough space remaining within housing 10, which can be used to accommodate further electronic components.

It is also possible that transformers 11/21 and 12/22 are coupled via a respective magnetic core (not shown) which advantageously has one or more air gaps.

Primary coils 11, 12 are arranged within energy transfer wall 15 by means of MID technology so as to be isolated. Other encapsulation methods may also be employed.

Optionally, the energy transfer wall 15 and the additional circuit board 2 comprising integrated electronics may be joined solidly and permanently to form the subscriber device whose constituent parts 2 and 15 at the same time form the housing 10. Circuit board 2 comprises the secondary coils 21, 22. Once the circuit board 2 has been attached to the energy transfer wall 15, the subscriber unit is ready for operation.

Due to the small spacing between the primary coil 11, 12 and the secondary coil 21, 22, power can be transferred efficiently.

The housing 10 typically having a width of 6.2 mm is latched or clipped to the support rail 5 and receives the required power supply voltages and data signals via connection means 3. In this exemplary embodiment, the bus system 4 comprises four lines: two for power supply, E1, E2, and two for signal supply, S1, S2.

In case of the embodiment of FIG. 6, the housing halves 13, 14 may be joined together by bonding or welding. The circuit board 2 with the electronic components 20 is thereby encapsulated in the housing 10. Therefore, the devices may even be used in potentially explosive areas. The connection to plug-in connectors 30 may also be encapsulated.

Feed electronics 16, 17 may comprise passive and active components, or may even only comprise a single resonance capacitor. If self-resonance effects of the coils can be exploited, a resonance capacitor may even be dispensed with under certain conditions.

Optionally, the housing 10 may be configured so as to accommodate a plurality of circuit boards 2. A specific shape of the housing and shape of the circuit board allows to ensure defined positions of the housing 10 relative to the circuit board 2. The electronic components 20 of the electronic circuit may be accommodated on or under or within circuit board 2. The secondary transfer elements 21, 22 connected thereto may likewise be either integrated into the circuit board 2 or arranged on outer layers thereof.

For shielding purposes, the housing of each subscriber unit may comprise a magnetically effective sheet or an enclosing ferrite foil. It is also possible to use for example copper or aluminum sheet metal for shielding purposes. A combination of magnetically effective and electrically conductive material layers is likewise possible.

FIG. 7 schematically illustrates an electrical device including a plurality of circuit boards 2 and adapted for electromagnetic power transfer and information transfer via flat coils as the primary and secondary transfer elements 11, 21, for power supply purposes and data transfer purposes. Primary transfer element 11 is shown to be disposed on the inner surface of the insulating housing wall 15; however, transfer element 11 could likewise be arranged encapsulated in the interior of housing wall 15. Information transfer elements 12, 22 may be provided and arranged similarly to power supply transfer elements 11, 21. FIG. 7 shows a connection means 3 in form of a line feed which is connected to feed electronics 16 which in turn feed the transfer element 11. The latter generates the electromagnetic alternating field as indicated by annular arrows, to which the transfer elements 21, 22 are exposed so as to accomplish the power supply and/or signal supply, depending on the type of use, to circuit boards 2. Electronic components, not illustrated, are accommodated in or on circuit boards 2. Further electronic components 20 may be arranged within the insulating walls of housing 10, which components are fed by connection means 3, optionally via feed electronics 18 and via lines 28 which extend in the interior of insulating housing walls or on the inner surface thereof. Housing 10 which is insulative in its essential parts, can be adapted to be dustproof or even gas-tight to be suitable for hazardous, potentially explosive areas.

FIG. 8 schematically illustrates an electrical device including an identification means. For this purpose, an RFID component 23 is encapsulated in an insulating wall of the housing 10 and may for example be read by a reader device, not illustrated. Circuit board 2 is arranged inside housing 10 (more than one circuit board may be provided), which circuit board carries electromagnetically effective transfer elements 11, 12 or accommodates them inside, which transfer elements may be controlled via connection means 3 and optionally via feed electronics 18. Electromagnetically effective transfer elements 21, 22 which may comprise flat coils, like transfer elements 11, 12, are provided within insulating wall portions of the housing 10. When transfer elements 11, 12 are energized and transfer elements 21, 22 are arranged so as to face transfer elements 11, 12, the correct assembly of the circuit board 2 can be checked through a response of the RFID component 23. A check for purposes of product piracy protection is also possible. The open design of housing 10 as illustrated is not mandatory. A closed configuration may be chosen.

Figure 9:
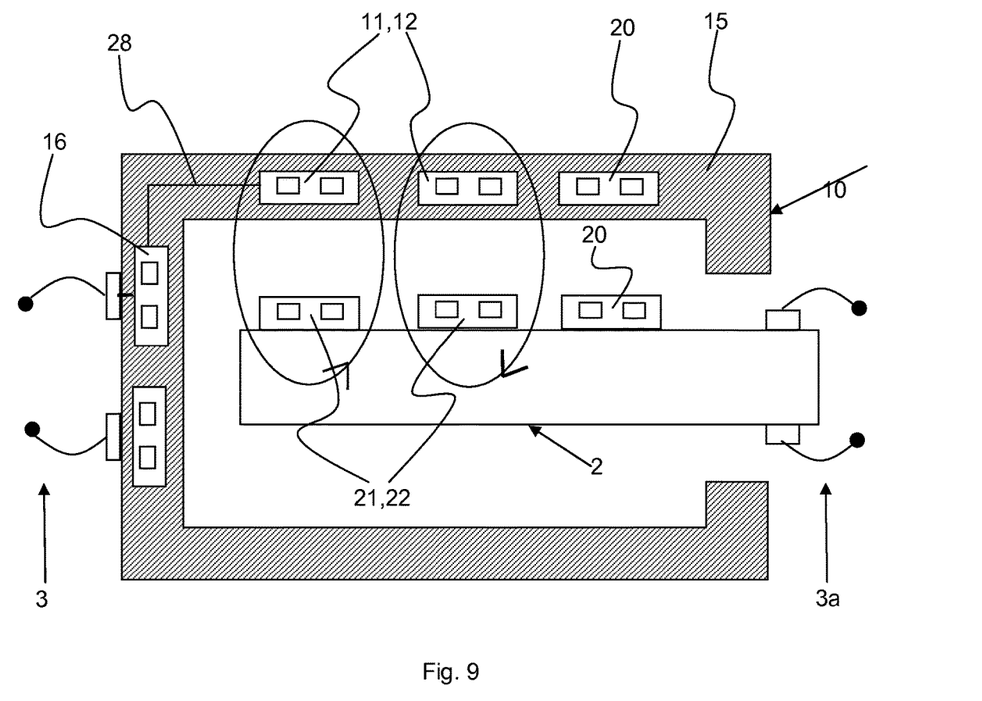
FIG. 9 shows an electrical device including an isolation amplifier functionality.

FIG. 9 schematically illustrates an electrical device with isolation amplifier functionality. The primary-side electromagnetically effective transfer elements 11, 12 are arranged encapsulated in the insulating wall 15 of housing 10 and can be operated with radio-frequency excitation current from connection means 3 via feed electronics 16. The secondary-side electromagnetically effective transfer elements 21, 22 are arranged on or inside circuit board 2.

Electronic components 20 may be accommodated in insulating walls of the housing 10 as well as in or on circuit board 2. Circuit board 2 has a further connection means 3a which enables to deliver electrical energy to further devices for power supply purposes and/or information transfer purposes.

By arranging electronic components 20 and electromagnetically effective transfer elements 11, 12, 21, 22 within insulating walls of the housing 10 or of the circuit board 2, optimum space utilization and compact design can be achieved. Moreover, galvanic isolation is achieved between the housing 10 and the circuit board 2. By using plastics as an insulating housing material and/or by filling the possibly resulting cavity with an electrically insulating medium so as to obtain encapsulation of the housing electronics 20, good isolation (dielectric strength) can be achieved.

REFERENCE NUMERALS

1 Subscriber device
2 Circuit board
3 Connection means
3a Further connection means
4 Bus system
5 Support rail
10 Housing
11 Primary transfer element
12 Primary transfer element
13 Housing part
14 Housing part
15 Energy transfer wall
16 Feed electronics
17 Feed electronics
18 Feed electronics
20 Electronic component
21 Secondary transfer element
22 Secondary transfer element
23 RFID component
28 Line
30 Connectors or contact-making means
31 Connecting line
32 Connecting line
33 Connecting line
34 Connecting line
E1, E2 Power supply lines
S1, S2 Data signal lines

What is claimed is:

1. A modular electronic system for receiving, processing or forwarding information, comprising:
   a circuit board including electronic components and one or more first electromagnetically effective transfer elements;
   a housing made at least in part of electrically insulating material and having one or more second electromagnetically effective transfer elements arranged on or in a first wall among a plurality of walls of the housing, and having a cavity adapted to accommodate the circuit board including the electronic components;
   connection means adapted to feed electrical power or for information transfer purposes,
   wherein the connection means are electrically or electromagnetically coupled with the one or more second electromagnetically effective transfer elements of the housing or the one or more first electromagnetically effective transfer elements of the circuit board; and
   wherein the one or more second electromagnetically effective transfer elements of the housing and the one or more first electromagnetically effective transfer elements of the circuit board are arranged for electromagnetic coupling.

2. The modular electronic system as claimed in claim 1, wherein the one or more first electromagnetically effective transfer elements and the one or more second electromagnetically effective transfer elements respectively include a first primary transfer element and a first secondary transfer element; and
   wherein the first primary transfer element and the first secondary transfer element are flat in a region where they face each other.

3. The modular electronic system as claimed in claim 1, wherein the circuit board is a part of one of the plurality of walls of the housing, or of an element accommodating the one or more first electromagnetically effective transfer elements is produced by means of molded interconnect device (MID) technology.

4. The modular electronic system as claimed in claim 1, wherein the housing is electrically insulative, at least in a region of the one or more second electromagnetically effective transfer elements.

5. The modular electronic system as claimed in claim 1, wherein a primary component of the one or more second electromagnetically effective transfer elements is arranged in the housing and a secondary component of the one or more first electromagnetically effective transfer elements is arranged on the circuit board.

6. The modular electronic system as claimed in claim 5, wherein the circuit board has a further connection means.

7. The modular electronic system as claimed in claim 1, wherein the electronic components include a radio frequency identification (RFID) component which is accommodated in the first wall of the housing, and wherein the first wall is electrically insulated.

8. The modular electronic system as claimed in claim 1, further comprising:
   a bus system;
   a number of subscriber devices with each one connected to the bus system via a respective one of the connection means, wherein each of the subscriber devices is adapted to be mounted and accommodated side by side on a support rail;
   the first wall forming a part of a respective subscriber device of the subscriber devices and including at least one first flat primary transfer element enclosed therein, the at least one first flat primary transfer element being the one or more second electromagnetically effective transfer elements; and
   the circuit board which in addition to the electronic components includes at least one flat first secondary transfer element for feeding rectifier components for power supply of the electronic components, the at least one first flat secondary transfer element being the one or more first electromagnetically effective transfer elements, wherein the first flat secondary transfer element is arranged facing towards and, adjacent to, the at least one first flat primary transfer element in the respective subscriber device for interaction by being coupled through a first electromagnetic alternating field.

9. The modular electronic system as claimed in claim 8, wherein the respective subscriber device includes the housing and housing parts, one part of the housing being the first wall, which is an energy transfer wall.

10. The modular electronic system as claimed in claim 8, wherein the first wall includes a second primary transfer element facing and adjacent to a second secondary transfer element of the circuit board for interaction by being coupled through a second electromagnetic alternating field and used for signal transfer, the second flat primary transfer element being another of the one or more second electromagnetically effective transfer elements, and the second flat secondary transfer element being another of the one or more first electromagnetically effective transfer elements.

11. The modular electronic system as claimed in claim 8, wherein each of the at least one flat first primary transfer element and the at least one flat first secondary transfer element is connected to respective associated feed electronics encapsulated in the first wall, which is an energy transfer wall.

12. The modular electronic system as claimed in claim 11, wherein the support rail supports power supply lines and signal lines which belong to the bus system and which are connected to the respective subscriber device via the respective one of the connection means; and wherein the connection means of the respective subscriber devices comprise plug-in connectors and lines leading to the respective associated feed electronics.

13. The modular electronic system as claimed in claim 8, wherein the support rail supports power supply lines and signal lines which belong to the bus system and which are connected to the respective subscriber device via the respective one of the connection means.

14. The modular electronic system as claimed in claim 13, wherein the connection means comprise an inductive or capacitive transformer.

15. A bus subscriber device for a modular electronic system, comprising:

a housing made of electrically insulating material, comprising an energy transfer wall;

a circuit board including electronic components, the circuit board inside of the housing, and the housing adapted to be mounted to a support rail;

wherein the energy transfer wall includes a first flat electromagnetically effective primary transfer element encapsulated within the energy transfer wall for power transfer purposes, and a second flat electromagnetically effective primary transfer element encapsulated within the energy transfer wall for signal transfer purposes; and wherein the circuit board includes a first flat electromagnetically effective secondary transfer element for power supply purposes and a second flat electromagnetically effective secondary transfer element for reception and transmission of signals, wherein the first and second flat electromagnetically effective secondary transfer elements are arranged facing towards and, respectively adjacent to, the first and second flat electromagnetically effective primary transfer elements, for coupling purposes.

* * * * *